United States Patent [19]

John et al.

[11] 4,402,762

[45] Sep. 6, 1983

[54] METHOD OF MAKING HIGHLY STABLE MODIFIED AMORPHOUS SILICON AND GERMANIUM FILMS

[76] Inventors: Puthenveetil K. John, 214 Wychwood Park, London, Ontario, Canada, N6G 1S3; Bok Y. Tong, 2 Milford Crescent, London, Ontario, Canada, N5X 1A8; Sau K. Wong, 673 Cranbrook Rd., London, Ontario, Canada, N6K 1W8; Kin P. Chik, 154 Argyle St., Block 5, 14th Flr., Flat E, Kowloon, Hong Kong

[21] Appl. No.: 269,741

[22] Filed: Jun. 2, 1981

[51] Int. Cl.$^3$ .................. H01L 21/203; H01L 21/263
[52] U.S. Cl. ..................................... 148/1.5; 148/174; 29/572; 29/576 B; 29/576 T; 136/258; 357/2
[58] Field of Search .................. 136/258 AM; 29/572, 29/576 T, 576 B; 148/1.5, 174; 357/2, 4, 59; 204/192 S; 427/38, 85, 86

[56] References Cited

U.S. PATENT DOCUMENTS

| | | | |
|---|---|---|---|
| 4,151,058 | 4/1979 | Kaplan et al. | 357/2 X |
| 4,226,898 | 10/1980 | Ovshinsky et al. | 357/2 X |
| 4,239,554 | 12/1980 | Yamazaki | 357/2 X |
| 4,285,762 | 8/1981 | Moustakas | 136/258 AM X |
| 4,289,822 | 9/1981 | Shimada et al. | 136/258 AM X |

FOREIGN PATENT DOCUMENTS

| | | | |
|---|---|---|---|
| 2906058 | 8/1980 | Fed. Rep. of Germany | 136/258 AM |
| 54-20671 | 2/1979 | Japan | 29/576 T |
| 56-23748 | 3/1981 | Japan | 29/576 T |

OTHER PUBLICATIONS

Chik, K. P., et al., *Solid State Communications*, vol. 33, pp. 1019–1023, 1980.
Dembinski, M. et al., *Applied Physics Letters*, vol. 34, No. 9, (May 1, 1979), pp. 553–555.
Jang, J. et al., Journal of Non-Crystalline Solids, vol. 35–36, (1980), pp. 313–318.

*Primary Examiner*—L. Dewayne Rutledge
*Assistant Examiner*—Alan E. Schiavelli
*Attorney, Agent, or Firm*—Shenier & O'Connor

[57] ABSTRACT

A method of modifying amorphous films of Group IV elements such as silicon and germanium and alloys thereof with carbon by the addition of Group I elements hydrogen and/or Group VII elements fluorine and chlorine in which an amorphous film of the Group IV elements or alloys thereof is vacuum deposited on a substrate at a temperature equal to or slightly above room temperature, the film is annealed in an inert gas or in a vacuum and the annealed film is modified by bombardment with an energetic current of ions or atoms of the Group I and/or Group VII elements by means of a plasma gun or ion gun having characteristics similar to a thetatron.

2 Claims, 2 Drawing Figures

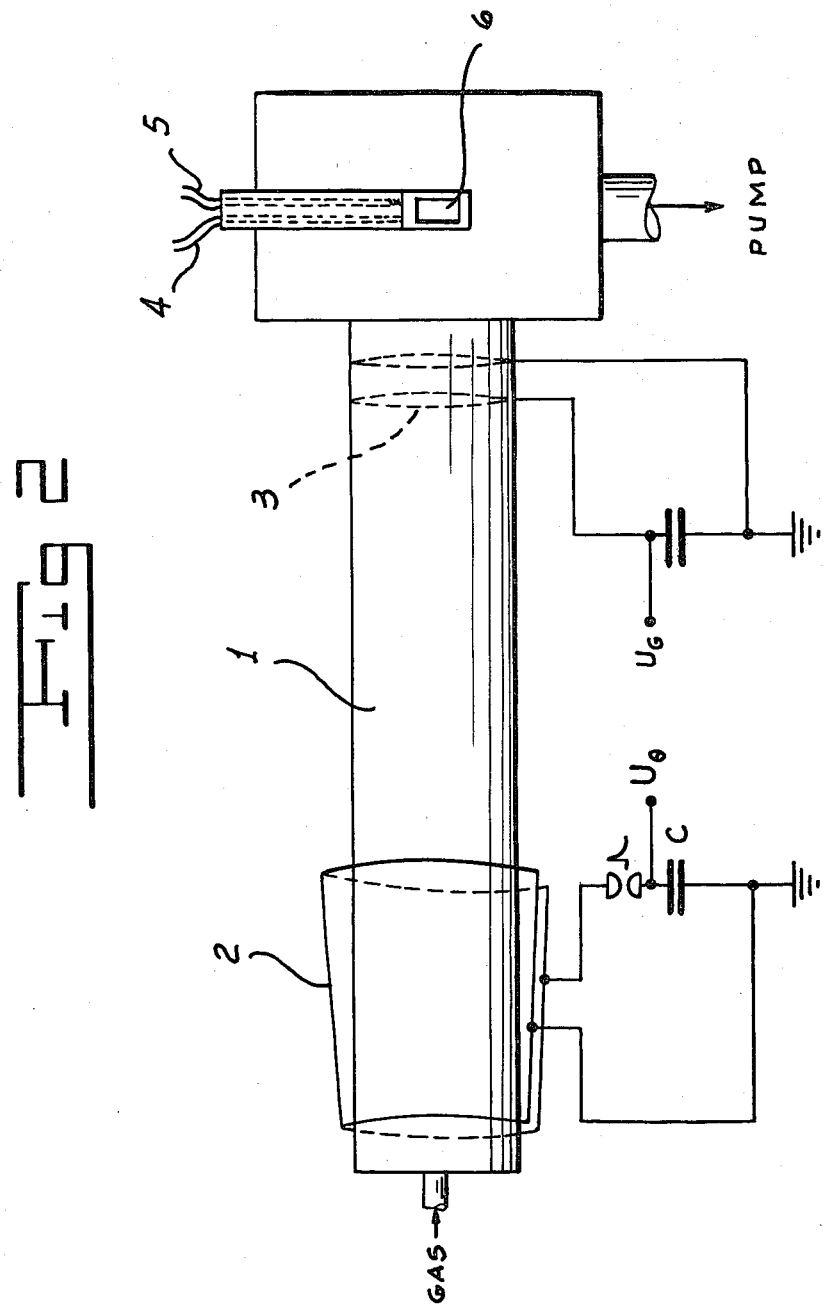

METHOD OF MAKING HIGHLY STABLE MODIFIED AMORPHOUS SILICON AND GERMANIUM FILMS

BACKGROUND OF THE INVENTION

Large scale manufacture of electronic devices such as solar cells is economically feasible only if thin films are used. But in thin film form Silicon and Germanium are amorphous. Presently available amorphous films of pure Silicon or Germanium (Groups IV) fail to behave as good intrinsic semiconductors. The reason is that as these materials are deposited in the laboratory in thin film form their energy band gaps are filled with localized states, generally attributed to microvoids, dangling bonds and lone pairs. Such energy gap states are not removed by doping, annealing or by varying the film deposition conditions. These problems prevent the use of such films in electronic devices especially if they involve changes in the position of the Fermi level, for example by controlled doping with Group III and Group V atoms.

The present invention is based on theoretical observations by Choo and Tong (Proc. VII International Conf. on Amorphous and Liquid Semiconductors, Edinburgh (1977) p. 120–124; Solid State Communications vol. 25, p. 385–387 (1978)) that hydrogen incorporated into amorphous silicon (a-Si) or amorphous germanium (a-Ge) removes the localized states from the gap. Hydrogen acts as a modifier. The hydrogen-modified amorphous silicon or amorphous germanium is a better semiconductor with a well defined energy gap. The function of modification is quite different from that of doping. For a Group IV element such as silicon the doping agents are usually atoms of the nearby Group III and Group V elements. The doping atom introduces an extra free electron from the Group V elements or free hole from the Group III elements thereby greatly affecting the conductivity through the Fermi level. The doping agent does not change the energy gap of the material other than introducing an extra state (donor or acceptor state) in the gap. The main function of a modifier on the other hand is to remove the localized states from the band gap of the imperfect laboratory deposited a-Si or a-Ge films. It does not contribute directly as a free electron or hole carrier, but affects the conductivity through the modification of the energy gap of the matrix amorphous semiconductor. Thus modified, the amorphous Group IV semiconductor is then ready for doping. Another difference between the roles of modifier and dopant can be seen in the amount of modifier and doping atoms required for a laboratory-produced amorphous semiconductor. The amount of modifier needed is directly related to the number of microvoids, dangling bonds, lone pairs and other imperfections in the a-Si or a-Ge which range from 0.1 to 30 atomic percent depending on the process of producing the film. The amount of dopant atoms on the other hand defines the number of current carriers and is usually much less. Modification is the first stage of treatment before the deposited amorphous film can be doped and fabricated into devices such as solar cells, TV vidicons, Xerographic devices, etc. We believe a suitable modifier for amorphous silicon and germanium of the Group IV elements would be Group I atoms like hydrogen and/or Group VII atoms such as fluorine and other halogens.

Several methods have been proposed to introduce modifiers into amorphous silicon and/or amorphous germanium. The better known methods are for example the radio frequency glow discharge of $SiH_4$ (Spear et al, Solid State Communications, vol. 17, p. 1193–1196 (1975)), $SiF_4$ or reactive sputtering. In these methods the matrix element silicon is deposited simultaneously with the modifier hydrogen or fluorine. This approach suffers from difficulties of controlling the amount of modifier atoms introduced in the sample. The presence of modifier atoms during deposition also affects the structure of the film. The result is that the product is unstable under heat and light illumination and has poor reproducibility. The hydrogen content of the resulting sample is too high (about 5 to 30 atomic percent) for the hydrogen to be considered as a modifier. From the principles of the present invention one can see why the above approach does not meet with greater success. Based on the general principles outlined above, one should first prepare a film of the matrix semiconductor of Group IV element which contains as few gap states as possible, followed by the introduction of just the sufficient amount of modifier atoms to remove the gap states.

BRIEF DESCRIPTION OF THE DRAWINGS

In the accompanying drawings to which reference is made in the instant specification and which are to be read in conjunction therewith:

FIG. 2 is a diagrammatic view of a thetatron gun.

DESCRIPTION OF THE PREFERRED EMBODIMENT

Figure 1:
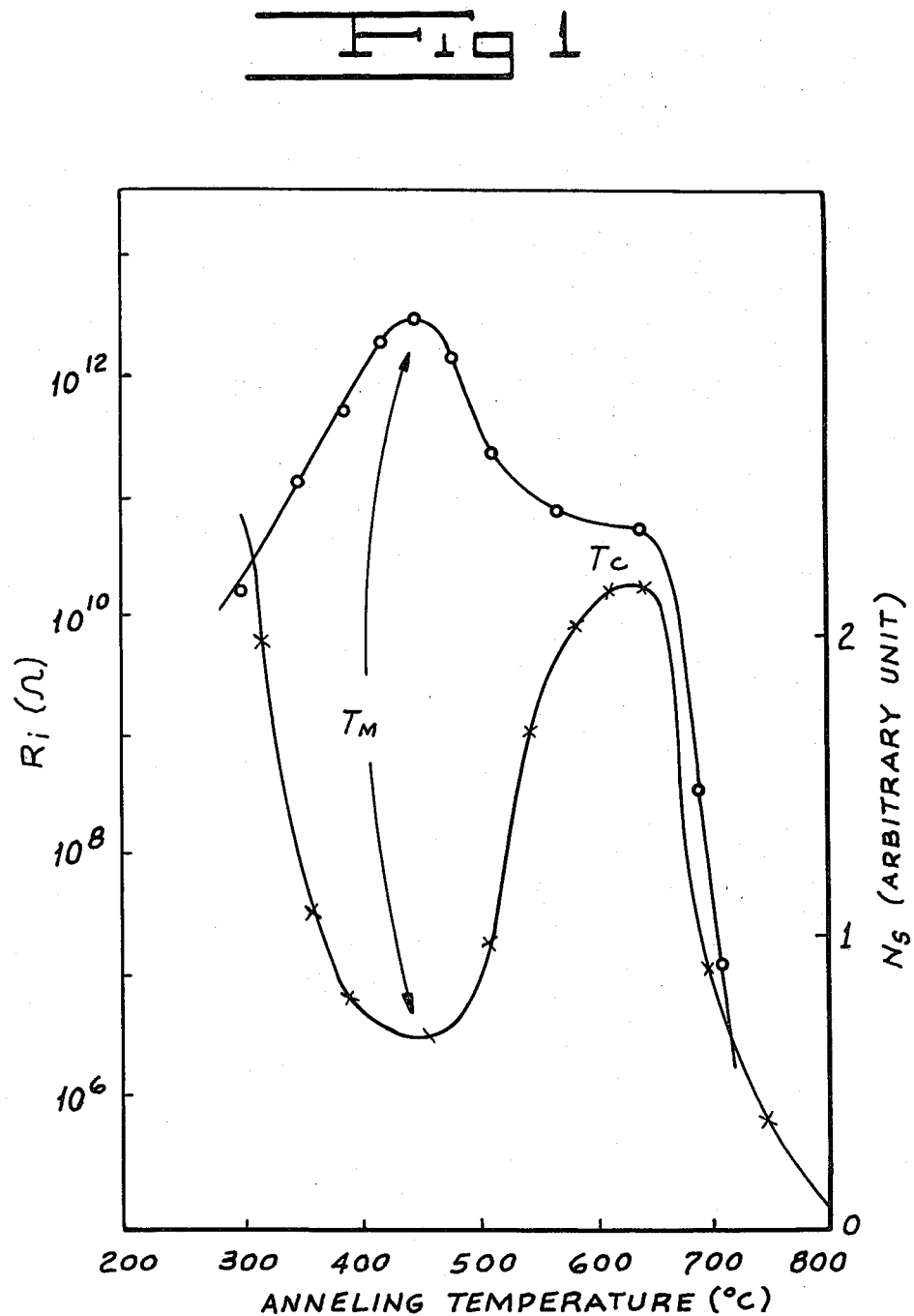
FIG. 1 is a graph illustrating the relationship between resistivity of silicon and germanium films and annealing temperature.

The present invention provides a method for producing modified amorphous semiconductor films, mainly Group IV elements such as silicon, germanium or alloys of carbon in silicon or germanium that are highly stable under heat (below recrystallization temperature) and under light illumination. The characteristics of the said material are easily reproducible. The modified film contains only a small amount of modifier atoms with a bulk concentration of less than 3 atomic percent.

The said process consists of the following steps:

(a) Deposition of a film of the matrix amorphous material from the Group IV elements such as silicon, germanium, or alloys of the same with carbon, on a substrate under vacuum and heat annealing treatment. Amorphous films are prepared by vacuum evaporation at background pressure of $10^{-5}$ Torr or lower of pure matrix material on to a substrate (for example Corning glass 7059) at room temperature or at a temperature slightly above room temperature. The deposition rates vary from 0.1 Å per sec to 125 Å per sec and film thickness range from 0.1 $\mu$m to 5 $\mu$m depending on the requirement of the needed device. This is followed by a crucial annealing treatment while under a vacuum or in an inert gas to produce a matrix film that is best suited for the introduction of modifiers. It has been observed that electrical resistivities of evaporated amorphous silicon and amorphous germanium films at room temperature are increased by annealing at higher temperatures and begins to drop sharply when crystallization sets in. Chik et al (J. Non-Crystalline Solids, vol. 24, p. 431–435 (1977)) observed that the resistivity drops in two steps as annealing temperature is increased. The first drop begins at a temperature $T_M$ well below the second step which starts at the crystallization temperature $T_C$. This region between $T_M$ and $T_C$ denoted by I in FIG. 1, has been shown to be associated with the regeneration of dangling bonds, based on simultaneous measurements of electron spin resonance signal $N_S$ and resistance $R_i$. (Chik et al, Solid State Communications vol. 33, p. 1019 (1980)). In the region above temperature $T_C$, denoted by II in FIG. 1, recrystallization starts, with a steady reduction in electron spin resonance signal. Annealing can be carried out at a temperature of between 100° C. and a temperature of crystallization of the film. Stated otherwise, the annealing may be carried out at a temperature between the temperature of maximum electrical resistance and minimum electrical spin and a temperature at which re-crystallization starts.

Although introduction of modifier atoms, to be described later in stage (b), is still effective even without heat annealing or with annealing treatment below temperature $T_M$, we have found that the most stable and the best modified amorphous films are obtained by annealing at temperature in the region I (FIG. 1) between temperatures $T_M$ and $T_C$. $T_M$ is approximately 450° C. for amorphous silicon and approximately 370° C. for amorphous germanium. In this way the dangling bonds generated by microvoids associated with impurity atoms such as oxygen are removed in the stage (b) modification process. Once so annealed the amorphous sample can be exposed to the atmosphere for extended periods of time and still be usable in the stage (b) modification phase. This annealing treatment at temperatures in the region I (FIG. 1) is an important step in the present invention and is partially responsible for the stability of the final modified amorphous semiconductor.

Even the ultrahigh vacuum used in amorphous film deposition, for example that used by Kaplan et al (Applied Physics Letters, vol. 33, p. 440-442 (1978)), is not sufficient to preclude the trapping of impurity atoms such as oxygen even at pressures as low as $10^{-10}$ Torr (M. L. Knotek, Tetrahedrally bonded semi-conductors, Proc. AIP Conf. on Semi-Conductors, no. 20 (1974) p. 297). The annealing process described above enables us to work under ordinary vacuum condition of $10^{-5}$ to $10^{-7}$ Torr and thus eliminate the need for very costly ultrahigh vacuum systems. Also, unlike Kaplan et al (1978), immediate modification of the freshly prepared amorphous film is not necessary. In fact, an annealed film contains fewer gap states and fewer regeneratable gap states than a freshly deposited film. This is another reason for the good quality of the said modified material. A less economic alternative procedure is to deposit the film onto a substrate heated up to the temperatures in region I and leave the freshly deposited film in the evaporator at that temperature for a suitable length of time for annealing.

(b) Modification of the deposited matrix film. The film prepared and annealed on a substrate as described in section (a) above, is then bombarded with modifier atoms or ions of Group I elements such as hydrogen or Group VII elements such as fluorine, chlorine, bromine, and iodine and/or hydrogen halides such as HF and/or hydrides of Group IV elements such as $SiH_4$ and $SiF_4$ in a thetatron gun or other equivalent ion gun or plasma gun. The modifier atoms or ions have energies above 10 eV and below an energy level which would damage the film. One particular form of the thetatron gun (M. Dembinski et al, Applied Physics Letters, Vol. 34, p. 553-555 (1979)) is depicted in FIG. 2. A plasma is produced in a tube (1) by discharging a capacitor through a single turn coil (2). Appropriate potentials are applied across the Gap (3). The accelerated particles are incident on the amorphous film (6). A heater (4) heats the sample and a thermocouple (5) measures the temperature. Typically, the particle current density incident on the films can be varied from 0.01 A-cm$^{-2}$ to 100 A-cm$^{-2}$ and particle energy can be varied between 50 eV to 50 keV. The number of current pulses is between about 10 and about 1000. The film is maintained at a temperature of region I, for example, about 520° C. for silicon and about 400° C. for germanium. Other variant forms of the ion gun and/or plasma gun may also be used for modification of the amorphous film so long as similar ranges of current, energy, and sample temperature can be maintained. For example, the standard plasma guns used in semiconductor doping can be used in this modification stage, but since the current in these standard guns is much smaller, a longer exposure time would be required than in the present example. The energy of the modifier ions or atoms should be varied during the process of modification from about 100 eV to the highest possible energy that could be used without causing large scale damage to the silicon or germanium film. The recommended range is 0.5-25 keV. A spray of electrons on the sample film is recommended to avoid charge build up and damage to the film during modifications. The temperature of the film should be maintained within the range recommended in conjunction with the thetatron system. The steps of the process may be repeated a number of times to produce a thick film adapted to be used directly in device fabrication with a film of between 0.05 to 5 microns being produced each time.

Compared to other methods of simultaneous deposition of matrix and modifier, for example the rf dissociation of silane gas, the modification by the method of the present invention enables precise control on the amount of modifier atoms introduced into the sample and their depth in the sample. The final product, thus deposited, thus annealed and thus modified by the said method in a thetatron or similar plasma gun has high qualities of stability and reproducibility. The conductivity and photoconductivity of the thus modified material do not show any degradation under continuous and/or on-off illumination with 200 mW cm$^{-2}$ white light and without heat filter over extended periods of exposure.

Having thus described our invention, what we claim is:

1. A method of modifying amorphous films of Group IV elements such as silicon and germanium and alloys thereof with carbon by the addition of Group I elements hydrogen and/or Group VII elements fluorine and chlorine comprising the steps of:
    (a) vacuum deposition of the amorphous film of said Group IV elements or alloys thereof on a substrate at a temperature equal to or slightly above room temperature at a partial vacuum in the range of between about $10^{-5}$ Torr and $10^{-7}$ Torr;
    (b) annealing said film in an inert gas or in a vacuum at a temperature between 450° C. and 600° C. for silicon and between 300° C. and 500° C. for germanium and;
    (c) modifying said annealed film by bombardment with an energetic and directional current of ions or atoms of said Group I and/or said Group VII elements by means of a plasma gun or ion gun, the energy of the ions and/or atoms of which is some discrete value between 0.5 Kev and 25 Kev and the current density is in the range of 0.1 to 100 A/cm$^2$, characteristics similar to a thetatron.

2. A method as in claim 1 including repeating said steps to produce a thick film ranging from 0.1 to 5 microns adapted to be used directly in device fabrication.

* * * * *